(12) United States Patent
Yoon et al.

(10) Patent No.: US 8,441,854 B2
(45) Date of Patent: May 14, 2013

(54) NONVOLATILE MEMORY APPARATUS CAPABLE OF REDUCING CURRENT CONSUMPTION AND RELATED DRIVING METHOD

(75) Inventors: Eui Sang Yoon, Ichon-si (KR); Young Soo Park, Ichon-si (KR); Jae Yun Kim, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 146 days.

(21) Appl. No.: 12/968,192

(22) Filed: Dec. 14, 2010

(65) Prior Publication Data

US 2012/0081961 A1  Apr. 5, 2012

(30) Foreign Application Priority Data

Sep. 30, 2010 (KR) .................. 10-2010-0095639

(51) Int. Cl.
*G11C 16/04* (2006.01)
*G11C 16/06* (2006.01)
*G11C 7/10* (2006.01)

(52) U.S. Cl.
USPC ............. 365/185.17; 365/185.05; 365/189.02

(58) Field of Classification Search .............. 365/185.17
See application file for complete search history.

(56) References Cited

U.S. PATENT DOCUMENTS

| | | | | |
|---|---|---|---|---|
| 5,936,887 A * | 8/1999 | Choi et al. | ............... | 365/185.17 |
| 6,028,788 A * | 2/2000 | Choi et al. | ............... | 365/185.11 |
| 6,577,533 B2 * | 6/2003 | Sakui et al. | ............... | 365/185.05 |
| 6,845,042 B2 * | 1/2005 | Ichige et al. | ............. | 365/185.17 |
| 7,259,991 B2 * | 8/2007 | Aritome | .................... | 365/185.17 |
| 7,433,231 B2 * | 10/2008 | Aritome | .................... | 365/185.17 |
| 7,486,554 B2 * | 2/2009 | Park et al. | ................. | 365/185.02 |
| 7,616,490 B2 * | 11/2009 | Mokhlesi et al. | ........ | 365/185.17 |
| 7,830,724 B2 * | 11/2010 | Park et al. | ................. | 365/185.29 |
| 7,839,694 B2 * | 11/2010 | Joe et al. | ................... | 365/185.23 |
| 7,843,731 B2 * | 11/2010 | Park et al. | ................. | 365/185.05 |
| 7,916,547 B2 * | 3/2011 | Hosono | .................... | 365/185.21 |
| 8,018,782 B2 * | 9/2011 | Park et al. | ................. | 365/185.29 |
| 8,027,199 B2 * | 9/2011 | Hwang et al. | ............ | 365/185.11 |
| 2005/0265078 A1 | 12/2005 | Lee | | |
| 2007/0242512 A1 | 10/2007 | Park et al. | | |
| 2009/0290421 A1 | 11/2009 | Park et al. | | |
| 2010/0046290 A1 * | 2/2010 | Park et al. | .................. | 365/185.2 |

FOREIGN PATENT DOCUMENTS

| | | |
|---|---|---|
| JP | 2007-012240 | 1/2007 |
| KR | 1019980022229 A | 7/1998 |
| KR | 10-0816123 B1 | 3/2007 |

* cited by examiner

*Primary Examiner* — Son Mai
(74) *Attorney, Agent, or Firm* — William Park & Associates Patent Ltd.

(57) ABSTRACT

Various exemplary embodiments of a nonvolatile memory apparatus are disclosed. In one exemplary embodiment, the memory apparatus may include: a page buffer; an even bit line connected to the page buffer; an odd bit line connected to the page buffer; an even memory cell string installed on the even bit line; an odd memory cell string installed on the odd bit line; and a bit line select unit configured to selectively generate a signal read path between the even bit line and the even memory cell string or between the odd bit line and the odd memory cell string.

29 Claims, 8 Drawing Sheets

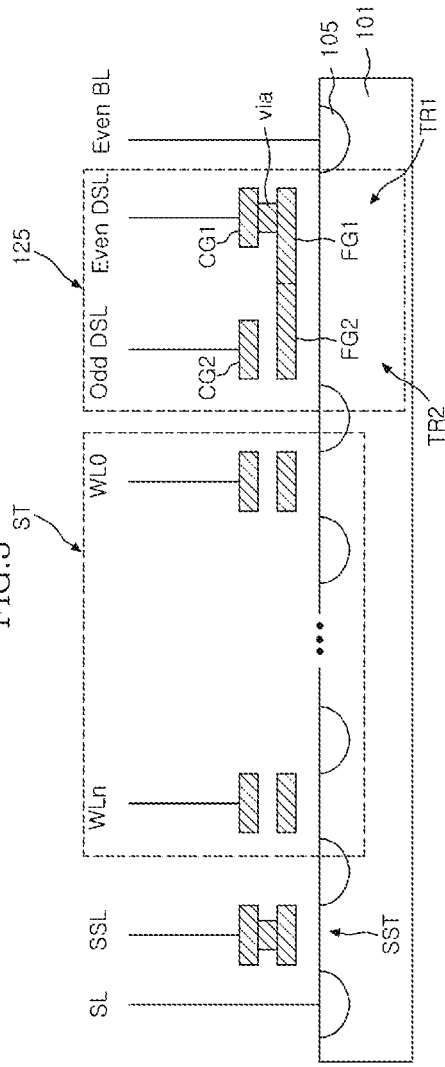
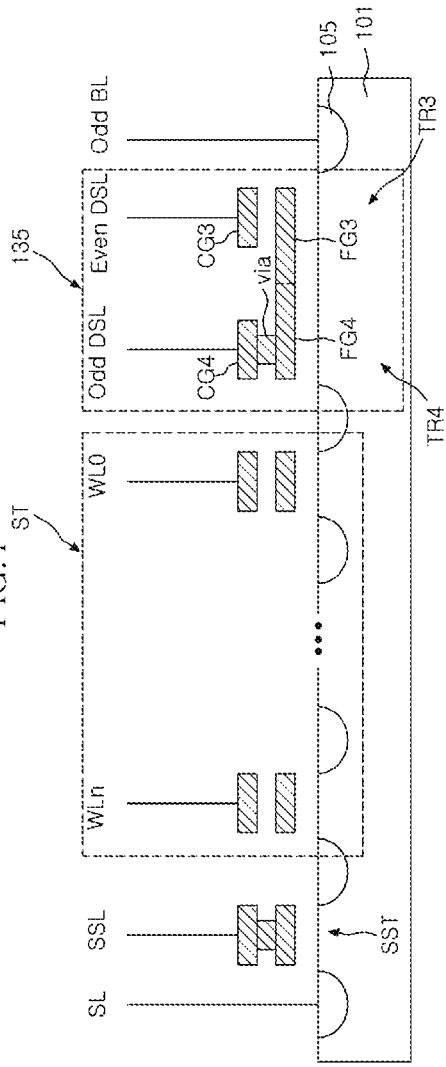

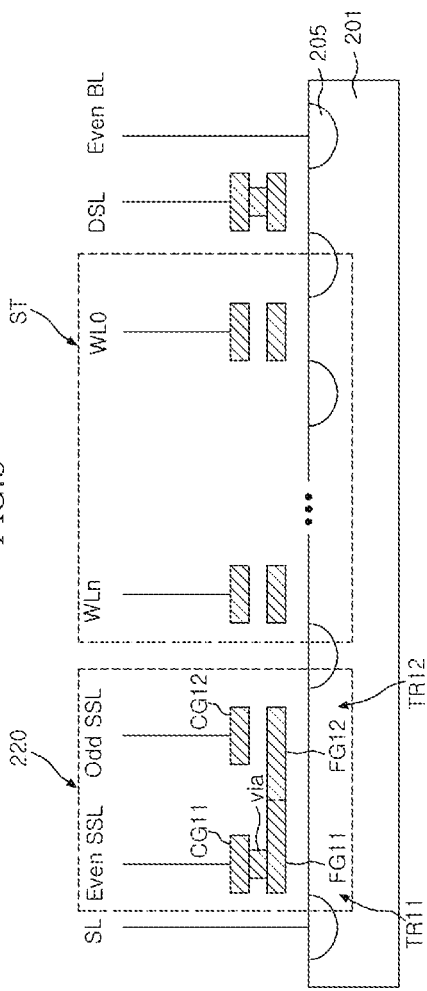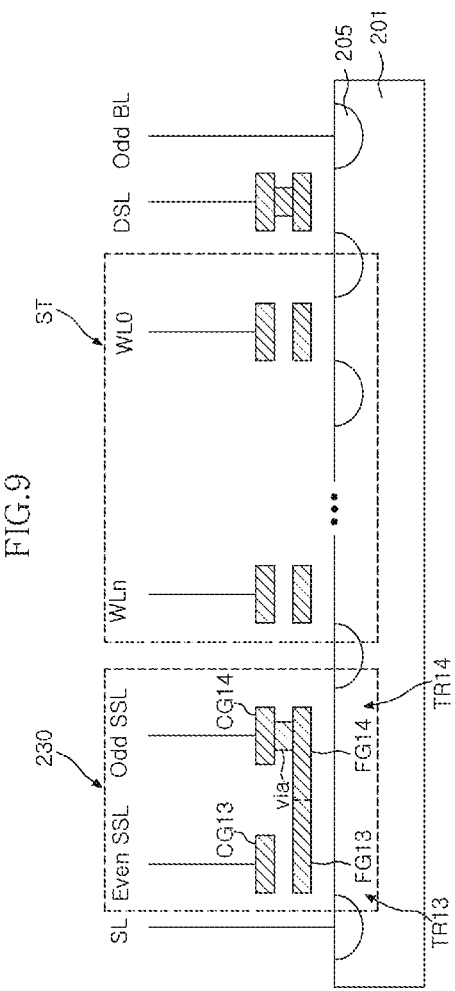

NONVOLATILE MEMORY APPARATUS CAPABLE OF REDUCING CURRENT CONSUMPTION AND RELATED DRIVING METHOD

CROSS-REFERENCE TO RELATED APPLICATION

The present application claims priority under 35 U.S.C. §119(a) to Korean Application No. 10-2010-0095639, filed on Sep. 30, 2010, in the Korean Intellectual Property Office, which is incorporated herein by reference in its entirety as if set forth in full.

BACKGROUND

1. Technical Field

Various embodiments of the present invention relate to a nonvolatile memory apparatus and a method for driving the same and, more particularly, to a flash memory apparatus and a related driving method, which may reduce current consumption of unselected bit lines.

2. Related Art

Flash memories are nonvolatile memory apparatuses that are widely used in portable electronic devices (e.g., notebooks, PDAs (personal digital assistants), and mobile phones), computer BIOSs (basic input/output systems), printers, and other various electronic parts such as USB (universal serial bus) drivers.

Such flash memories can be divided into a NAND-type and a NOR-type. Currently, NAND type flash memories are mainly used in consideration of an integration density and other reasons.

A NAND-type flash memory includes a plurality of memory cell blocks. Each of the memory cell blocks includes a drain select transistor, a source select transistor, and a memory cell string connected therebetween. The cell string refers to a device having, for example, 16 or 32 MOS transistors connected in series. These memory cell blocks are grouped to form a memory cell array.

FIG. 1 is a schematic circuit diagram illustrating a conventional flash memory. The flash memory of FIG. 1 includes a page buffer 15 to which a plurality of bit lines Even BL and Odd BL are coupled.

Each of the bit lines Even BL and Odd BL has a memory cell string ST in which a plurality of memory transistors T1-Tn are coupled in series. Drain select transistors (DST) 20 are coupled between memory cell strings ST and the bit lines Even BL and Odd BL, and source select transistors (SST) 30 are coupled between the memory cell strings ST and a source line SL.

The memory transistors T1-Tn of the cell strings ST are respectively driven in response to the signals of corresponding word lines WL0-WLn, the drain select transistors 20 are driven in response to the signal of a drain select line DSL, and the source select transistors 30 are driven in response to the signal of a source select line SSL.

In a flash memory having the above-described configuration, programming and verification steps are performed each bit line at a time as a unit. When performing a programming and/or verification step on a selected bit line, a specific voltage is discharged to the unselected bit line so as to shield the unselected bit line from performing programming or verification. For example, the unselected bit line is continuously applied with a driving voltage in a programming step to shield the unselected bit line and is applied with 0V voltage in a verification step to be discharged.

Thus, in the conventional flash memory, a prescribed voltage is applied to the unselected bit line to prevent it from driving when programming data to a predetermined memory cell, and 0V is applied to the unselected bit line when performing a verification step. Because a voltage swing in each of the steps is substantial, current consumption of the flash memory increases.

SUMMARY

Accordingly, there is a need for an improved flash memory apparatus that may reduce current consumption of unselected bit lines when, for example performing programming and/or verification.

To attain the advantages and in accordance with the purposes of the invention, as embodied and broadly described herein, one exemplary aspect of the present invention may provide a nonvolatile memory apparatus comprising: a page buffer; an even bit line connected to the page buffer; an odd bit line connected to the page buffer; an even memory cell string installed on the even bit line; an odd memory cell string installed on the odd bit line; and a bit line select unit configured to selectively generate a signal read path between the even bit line and the even memory cell string or between the odd bit line and the odd memory cell string.

In another exemplary aspect, a nonvolatile memory apparatus may include: an even bit line and an odd bit line; an even memory cell string disposed on the even bit line and comprising a plurality of flash memory transistors connected in series; an odd memory cell string disposed on the odd bit line and comprising a plurality of flash memory transistors connected in series; a first path section configured to transfer data stored in the even memory cell string and a signal transferred from the even bit line between the even memory cell string and the even bit line in response to an even drain select line when the even bit line is selected; and a second path section configured to transfer data stored in the odd memory cell string and a signal transferred to the odd bit line between the odd memory cell string and the odd bit line in response to an odd drain select line when the odd bit line is selected.

According to another exemplary aspect, a nonvolatile memory apparatus may include: an even bit line and an odd bit line; an even memory cell string connected to the even bit line and comprising a plurality of flash memory transistors connected in series; an odd memory cell string connected to the odd bit line and comprising a plurality of flash memory transistors connected in series; a first path section configured to transfer data stored in the even memory cell string and a signal transferred to the even bit line between the even memory cell string and the even bit line in response to an even source select line when the even bit line is selected; a second path section configured to transfer data stored in the odd memory cell string and a signal transferred to the odd bit line between the odd memory cell string and the odd bit line in response to an odd source select line when the odd bit line is selected; and a source line commonly coupled to the first and second path sections.

In some exemplary aspects, a nonvolatile memory apparatus may include: a first bit line; a second bit line; and a bit line select unit configured to generate a path for transferring data stored in a memory cell string installed on one selected between the first and second bit lines when reading data, the bit line select unit being further configured to shield a path between the unselected one of the first and second bit line and a memory cell string installed on the unselected bit line.

One exemplary aspect may provide a method for driving a nonvolatile memory apparatus comprising a plurality of bit lines each connected to a page buffer and having a memory cell string. The method may comprise: discharging a selected bit line from which data is to be read while an unselected bit line is being floated; precharging the selected and unselected bit lines with a predetermined voltage; and evaluating data stored in the memory cell string connected to the selected bit line while the unselected bit line is maintained at the predetermined voltage.

According to another exemplary aspect, a method for driving a nonvolatile memory apparatus comprising a page buffer, an even bit line connected to the page buffer, an even memory cell string installed on the even bit line, an odd bit line connected to the page buffer, an odd memory cell string installed on the odd bit line, a first path section configured to couple the even bit line and the even memory cell string in response to a signal of an even drain select line, and a second path section configured to couple the odd bit line and the odd memory cell string in response to a signal of an odd drain select line, the method may comprise evaluating data stored in the memory cell string installed on one bit line selected between the even and odd bit lines, and floating an unselected bit line and maintaining the unselected bit line at a predetermined voltage.

In various exemplary aspects, a method for driving a nonvolatile memory apparatus comprising a page buffer, an even bit line connected to the page buffer, an even memory cell string installed on the even bit line, an even drain switch configured to selectively switch the even bit line and the even memory cell string, an odd bit line coupled to the page buffer, an odd memory cell string installed on the odd bit line, an odd drain switch configured to selectively switch the odd bit line and the odd memory cell string, a first path section configured to connect the even memory cell string and a source line in response to a signal of an even source select line, and a second path section configured to couple the odd memory cell string and the source line in response to a signal of an odd source select line, includes the step of: evaluating data stored in the memory cell string installed on one bit line selected between the even and odd bit lines, and floating an unselected bit line.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 3 is a cross-sectional view illustrating an exemplary configuration of a first path section in the flash memory shown in FIG. 2.

FIG. 4 is a cross-sectional view illustrating an exemplary configuration of a second path section in the flash memory shown in FIG. 2.

FIG. 8 is a cross-sectional view illustrating an exemplary configuration of a first path section in the flash memory shown in FIG. 7.

FIG. 8 is a cross-sectional view illustrating an exemplary configuration of a second path section in the flash memory shown in FIG. 7.

DETAILED DESCRIPTION

Figure 2:
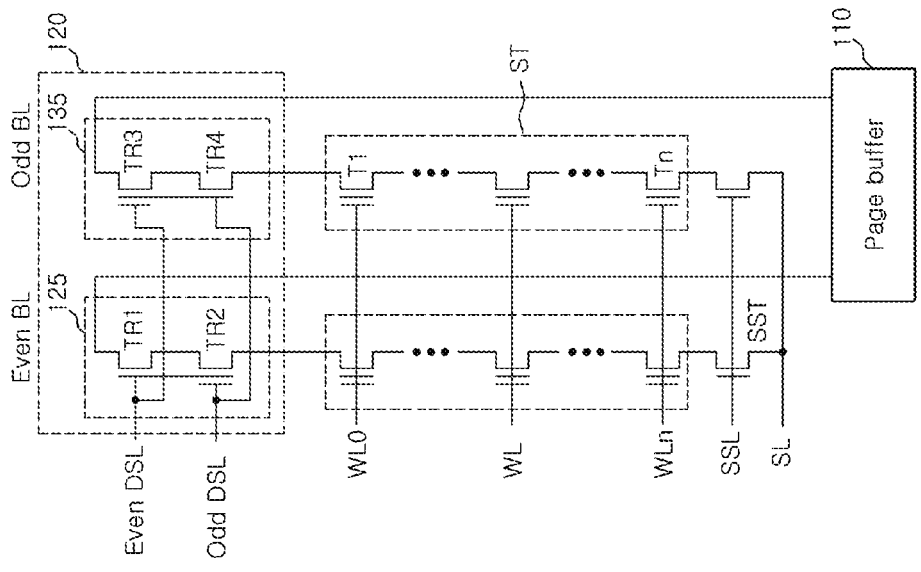
FIG. 2 is a schematic circuit diagram illustrating a flash memory in accordance with an exemplary embodiment of the present invention.
Figure 1:
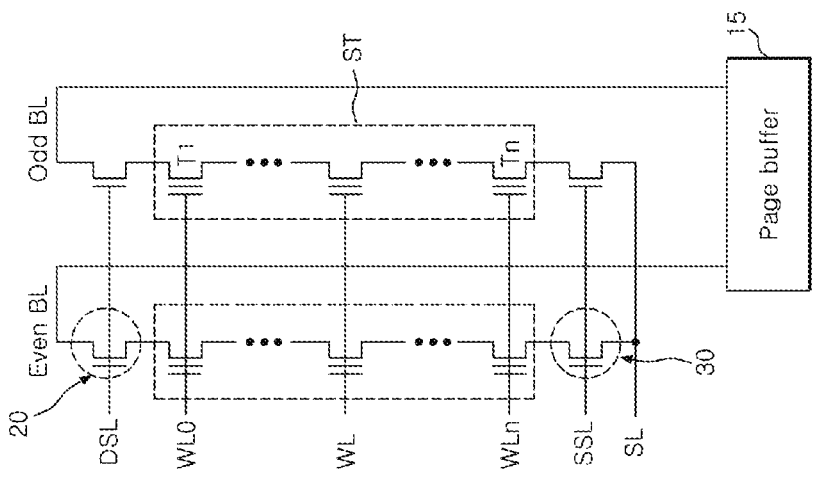
FIG. 1 is a schematic circuit diagram illustrating a conventional flash memory.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 2 is a schematic circuit diagram illustrating a flash memory in accordance with an exemplary embodiment of the present invention. With reference to FIG. 2, one page buffer coupled to a pair of bit lines will be exemplarily described for the sake of convenience in explanation.

Referring to FIG. 2, a flash memory 100 may include a page buffer 110, an even bit line Even BL, an odd bit line Odd BL, memory cell strings ST, a bit line select unit 120, and source select transistors SST. In this exemplary embodiment, while bit lines are termed as the even bit line Even BL and the odd bit line Odd BL, it is conceivable that the bit lines may be termed as a first bit line and a second bit line.

The page buffer 110 is coupled to the even bit line Even BL and the odd bit line Odd BL. The page buffer 110 functions to latch data that will be provided to the selected one of the even bit line Even BL or the odd bit line Odd BL. Alternatively or additionally, the page buffer 110 is configured to evaluate and store the data stored in the corresponding memory cell string ST.

The memory cell strings ST are respectively installed on the even bit line Even BL and the odd bit line Odd BL. Hereinafter, the memory cell string ST associated with the even bit line Even BL will be referred to as an even memory cell string, and the memory cell string ST associated with the odd bit line Odd BL will be referred to as an odd memory cell string. Each of the even and odd memory cell strings ST comprises a plurality of flash memory transistors T0-Tn which are coupled in series. The respective flash memory transistors T0-Tn are turned on in correspondence and response to the signals of a plurality of word lines WL0-WLn, which are provided from an X decoder (not shown).

The bit line select unit 120 is coupled between the even and odd bit lines Even BL and Odd BL and the even/odd memory cell strings ST. For example, the bit line select unit 120 is configured to generate a path between the even bit line Even BL and the even memory cell string ST and/or between the odd bit line Odd BL and the odd memory cell string ST in response to an even drain select line Even DSL and/or an odd drain select line Odd DSL.

The bit line select unit 120 is configured to generate a signal transfer path for one of the even and odd bit lines Even BL and Odd BL. The bit line select unit 120 may include a first path section 125 and a second path section 135.

The first path section 125 may serve as a switch that generates a signal transfer path between the even bit line Even BL and the even memory cell string ST in response to the signal of the even drain select line Even DSL.

The first path section 125 may comprise a first transistor TR1 configured to be turned on in response to the signal of the even drain select line Even DSL and a second transistor TR2 coupled in series to the first transistor TR1 and configured to be turned on selectively in response to the even or odd drain select line Even DSL or Odd DSL.

Referring to FIG. 3, the first transistor TR1 may have a structure similar to that of a flash memory transistor, and includes a first control gate CG1 and a first floating gate FG1 electrically coupled to each other by a contact via. As a result, the first transistor TR1 is driven like a general MOS transistor. The even drain select line Even DSL is coupled to the first control gate CG1 of the first transistor TR1.

The second transistor TR2 has the structure of a flash memory transistor that includes a second floating gate FG2 and a second control gate CG2. The odd drain select line Odd DSL is coupled to the second control gate CG2. The first floating gate FG1 of the first transistor TR1 and the second floating gate FG2 of the second transistor TR2 may be electrically coupled to each other. In certain exemplary embodiments, the first floating gate FG1 and the second floating gate FG2 may be integrated with each other. Reference numerals 101 and 105 in FIG. 3 designate a semiconductor substrate and a junction region (source/drain), respectively.

The second path section 135 may serve as a switch that generates a signal transfer path between the odd bit line Odd BL and the odd memory cell string ST in response to the signal of the odd drain select line Odd DSL.

The second path section 135 may comprise a third transistor TR3, which is configured to be turned on selectively in response to the signal of the even or odd drain select line Even DSL or Odd DSL, and a fourth transistor TR4, which is coupled in series to the third transistor TR3 and configured to be turned on selectively in response to the signal of the odd drain select line Odd DSL.

Referring to FIG. 4, the third transistor TR3 may have a structure of a flash memory transistor that includes a third control gate CG3 coupled to the even drain select line Even DSL and a third floating gate FG3 electrically isolated from the third control gate CG3.

The fourth transistor TR4 may have a structure of a general MOS transistor that includes a fourth control gate CG4 and a fourth floating gate FG4 electrically coupled to each other by a contact via and is driven in response to the signal of the odd drain select line Odd DSL.

The third floating gate FG3 of the third transistor TR3 and the fourth floating gate FG4 of the fourth transistor TR4 may be electrically coupled to each other. In some exemplary embodiments, they may be integrated with each other.

The source select transistors SST are respectively positioned between the even memory cell string ST and the source line SL and between the odd memory cell string ST and the source line SL.

The source select transistors SST are driven in response to the signal of a source select line SSL. The source select transistors SST and the source select line SSL for driving the source select transistors SST may constitute a switch for selecting the source of the memory cell string ST.

Figure 5A:
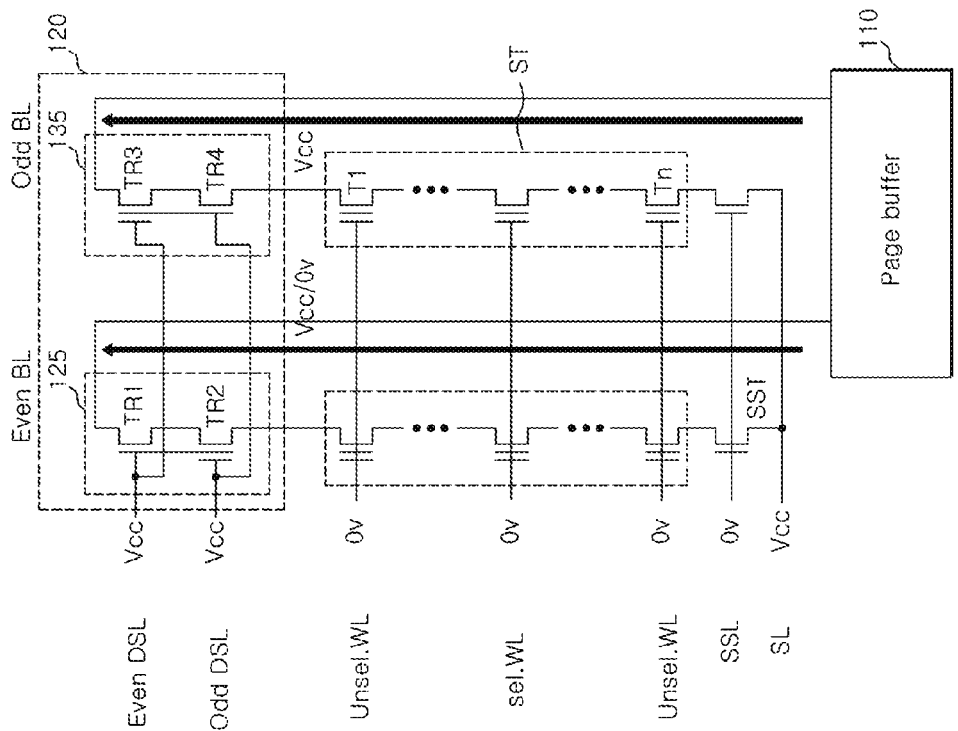
FIGS. 5A through 5C are circuit diagrams explaining an exemplary programming operation of a flash memory.
Figure 5B:
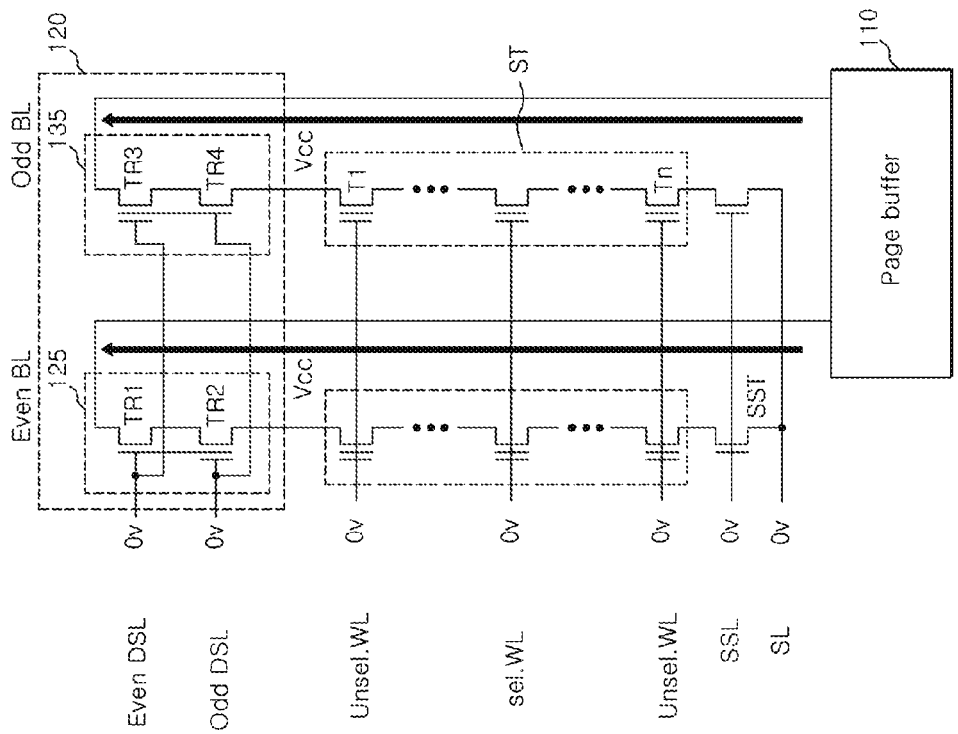
Figure 5C:
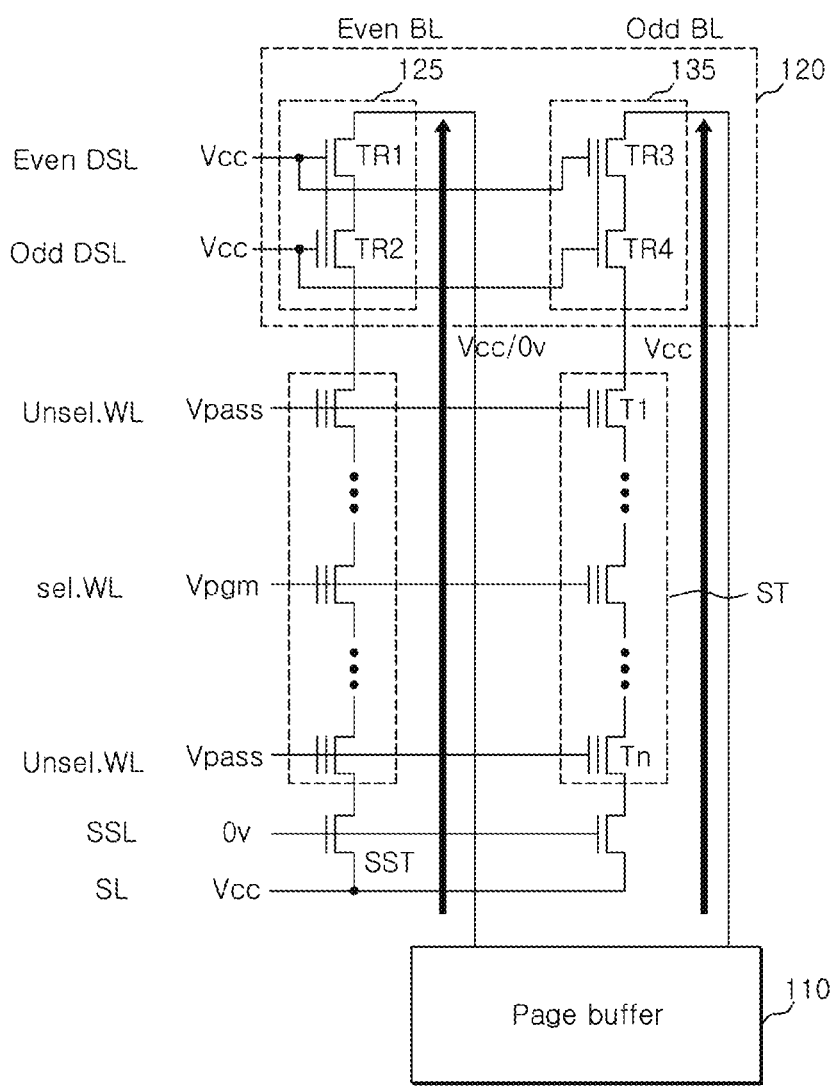

FIGS. 5A through 5C are circuit diagrams explaining an exemplary programming operation of a nonvolatile memory in accordance with various exemplary embodiments of the invention. For illustration purposes only, an exemplary operation of programming data to the even bit line Even BL will be described herein.

<Bit Line Precharge Step>

Referring to FIG. 5A, in the initial stage of a programming operation, a driving voltage Vcc is applied to the even bit line Even BL and the odd bit line Odd BL through the page buffer 110, and 0V is applied to the source line SL. At this time, the even and odd drain select lines Even DSL and Odd DSL are disabled to 0V, and thus the bit line select unit 120 is not driven. 0V is then applied to the control gates of the respective flash memory transistors that constitute the memory cell strings ST. Accordingly, the respective bit lines Even BL and the Odd BL are precharged with the driving voltage Vcc. The reference characters "sel.WL" and "unsel.WL" designate a word line signal inputted to a selected memory transistor and a word line signal inputted to unselected memory transistors, respectively.

<Bit Line Setup Step>

Referring to FIG. 5B, the driving voltage Vcc is supplied to the respective even and odd drain select lines Even DSL and Odd DSL. 0V is applied as both the selected word line signal sel.WL and the unselected word line signal Unsel.WL, and data to be programmed is provided to the selected bit line, for example, the even bit line Even BL.

When the data to be programmed is high, the driving voltage Vcc may be applied to the even bit line Even BL, and when the data to be programmed is low, 0V may be applied to the even bit line Even BL. 0V is applied as the signal of the source select line SSL, and the driving voltage Vcc is applied to the source line SL. Meanwhile, the unselected bit line, that is, the odd bit line Odd BL is precharged with the driving voltage Vcc to be prevented from being programmed.

<F-N Tunneling Step>

Referring to FIG. 5C, in a state where the corresponding data to be programmed is provided to the selected even bit line Even BL and the driving voltage Vcc is applied to the unselected odd bit line Odd BL to shield it, a program voltage Vpgm is applied as the selected word line signal sel.WL, and a pass voltage Vpass is applied as the unselected word line signal Unsel.WL.

For example, the pass voltage Vpass is a voltage of approximately 5 to 10V, which corresponds to a level capable of bypassing the flash memory transistors. The program voltage Vpgm is a voltage of approximately 10 to 15V, which corresponds to a level capable of inducing F-N tunneling between a floating gate and a channel. The driving voltage Vcc is applied to the even drain select line Even DSL, the odd drain select line Odd DSL, and the source line SL. 0V is supplied as the voltage of the source select line SSL.

As a result, F-N tunneling occurs only in the flash memory transistor of the memory cell string ST that is applied with the program voltage Vpgm. Accordingly, the corresponding data is written in the floating gate of the flash memory transistor. At this time, the source select transistors SST are turned off.

Figure 6A:
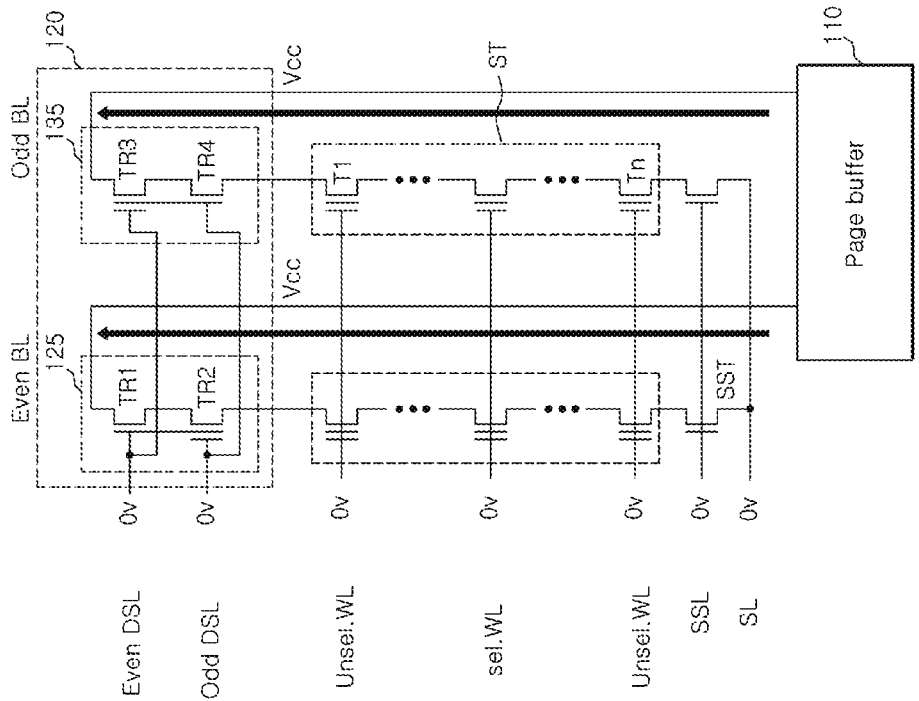
FIGS. 6A through 6C are circuit diagrams explaining an exemplary verification operation of a flash memory.
Figure 6B:
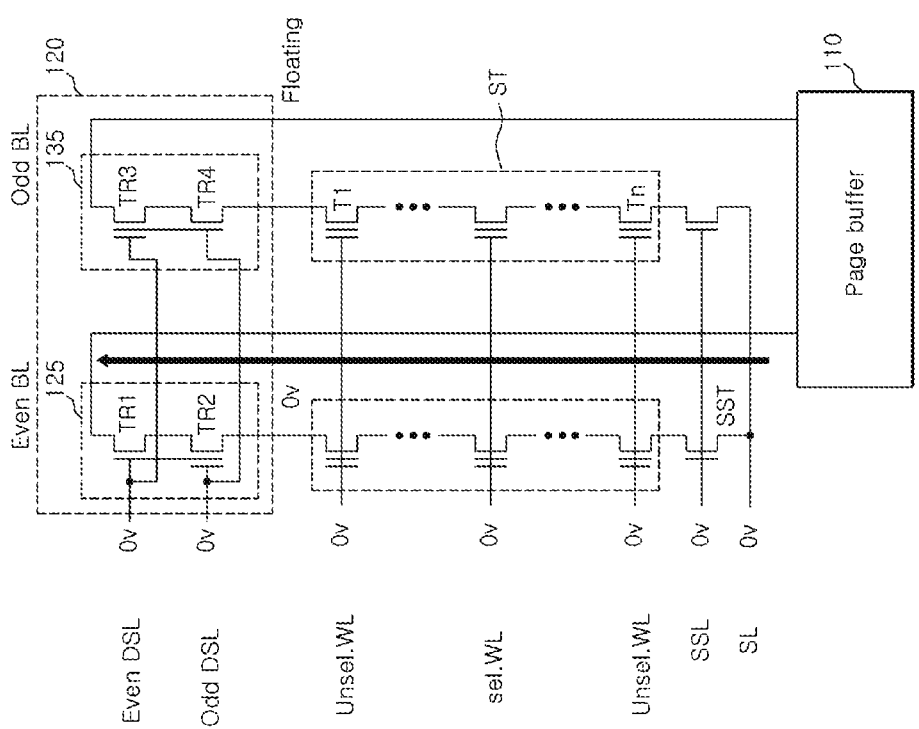
Figure 6C:
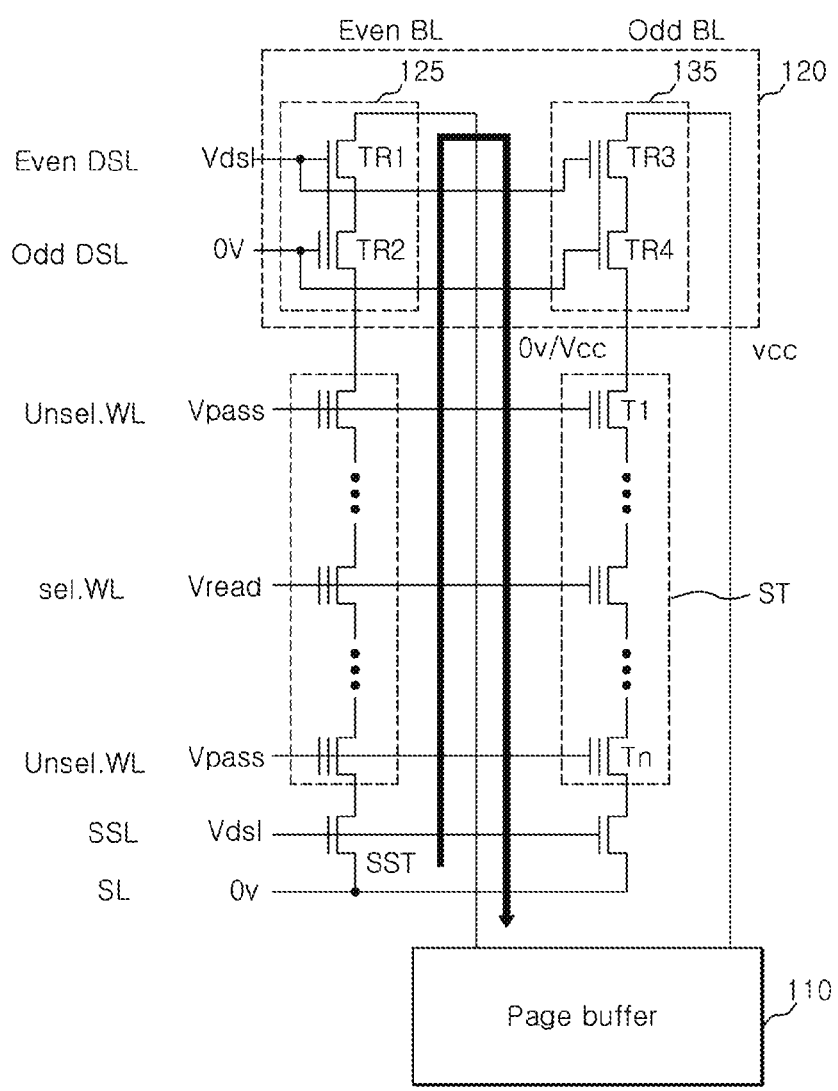

FIGS. 6A through 6C are circuit diagrams explaining an exemplary verification operation of a flash memory. For illustration purposes only, an exemplary operation of verifying the data stored in the programmed even bit line Even BL will be described herein.

<Bit Line Discharge Step>

When, as shown in FIG. 6A, 0V is applied to all of the even and odd drain select lines Even DSL and Odd DSL and the selected and unselected word lines sel.WL and Unsel.WL, 0V is supplied to the selected even bit line Even BL, and the unselected odd bit line Odd BL is floated. As a result, the even bit line Even BL to be verified is discharged.

<Bit Line Precharge Step>

Referring to FIG. 6B, in the above-described state where 0V is applied to all of the even and odd drain select lines Even DSL and Odd DSL and the selected and unselected word lines sel.WL and Unsel.WL, the driving voltage Vcc is applied to each of the even bit line Even BL and the odd bit line Odd BL, thereby precharging the even bit line Even BL and the odd bit line Odd BL.

<Bit Line Evaluation Step>

Referring to FIG. 6C, a drain select voltage Vdsl is applied to the even drain select line Even DSL and the source select line SSL, and 0V is applied to the odd drain select line Odd DSL.

Accordingly, a signal transfer path for electrically coupling the even bit line Even BL and the even memory cell string ST is generated in the bit line select unit 120. The drain select voltage Vdsl may be a voltage substantially equal to or greater than the threshold voltage of the transistors TR1-TR4 constituting the bit line select unit 120.

Generating the signal transfer path will be described in more detail herein. When the drain select voltage Vdsl (e.g., a voltage of a high level) is applied to the even drain select line Even DSL, and 0V is applied to the odd drain select line Odd DSL, the first through third transistors TR1, TR2 and TR3 of the bit line select unit 120 are turned on. At this time, even though the odd drain select line Odd DSL is coupled to the second control gate CG2 of the second transistor TR2, the second floating gate FG2 of the second transistor TR2, which is electrically coupled to the first floating gate FG1 of the first transistor TR1, functions practically as a gate. Thus, the second transistor TR2 is driven like a general MOS transistor. Accordingly, the signal transfer path is formed in the first path section 125. Meanwhile, even though the third transistor TR3 of the second path section 135 is turned on, since the odd drain select line Odd DSL is floated and the fourth transistor TR4 is turned off, the second path section 135 cannot generate a substantial signal transfer path.

While not shown in a drawing, in the event that the odd bit line Odd BL is selected, the drain select voltage Vdsl is applied to the odd drain select line Odd DSL, and 0V is applied to the even drain select line Even DSL. As a result, the second through fourth transistors TR2, TR3 and TR4 are turned on. At this time, even though the signal of the enabled odd drain select line Odd DSL is applied to the second control gate CG2 of the second transistor TR2 constituting the first path section 125, the second transistor TR2 does not substantially switch any signal because the first transistor TR1 is turned off. Because the third transistor TR3 is driven by the applied signal of the odd drain select line Odd DSL from the floating gate FG4 of the fourth transistor TR4, a signal transfer path is formed in the second path section 135.

At this state, the pass voltage Vpass is applied as the signal of the unselected word lines Unsel.WL, and a read voltage Vread is applied as the signal of the selected word line sel.WL. The pass voltage Vpass may have a voltage level capable of bypassing the flash memory transistors as described above, and the read voltage Vread may be 0V.

As a result, the level of the signal of the even bit line Even BL is changed depending upon the threshold voltage (Vth) of the selected flash memory transistor, and the value of the data stored in the corresponding flash memory transistor can be evaluated.

In other words, since the threshold voltage (Vth) of the flash memory transistor is changed depending upon a channel resistance (e.g., the charge amount of the floating gate), the level of the even bit line Even BL, with the unselected flash memory transistors bypassed, is determined depending upon the threshold voltage (Vth) of the selected flash memory transistor, and therefore, whether programming is passed or failed can be determined by sensing the level of the even bit line Even BL.

Thereafter, the evaluation step and the sensing step may be repeatedly performed.

As is apparent from the above descriptions, in a flash memory, consistent with the disclosed embodiments of the invention, since only the driving voltage Vcc is transferred to the unselected odd bit line Odd BL and/or the unselected odd bit line Odd BL is floated in the programming and verification steps, it may not be necessary to supply 0V. Consequently, current consumption can be reduced because a large voltage swing is not needed in the unselected bit line.

Moreover, in the verification step of the bit line, because the unselected bit line is precharged with the driving voltage Vcc while being in a floating state, the unselected bit line can be precharged with only as much voltage as the leakage voltage Vleak occurred upon floating. Thus, current consumption can be further reduced.

While the invention was described with an embodiment having a configuration to drive the bit line select unit 120 in response to the signal of the drain select lines DSL, it is conceivable that the bit line select unit 120 may be designed to be driven in response to the signal of the source select lines SSL.

Figure 7:
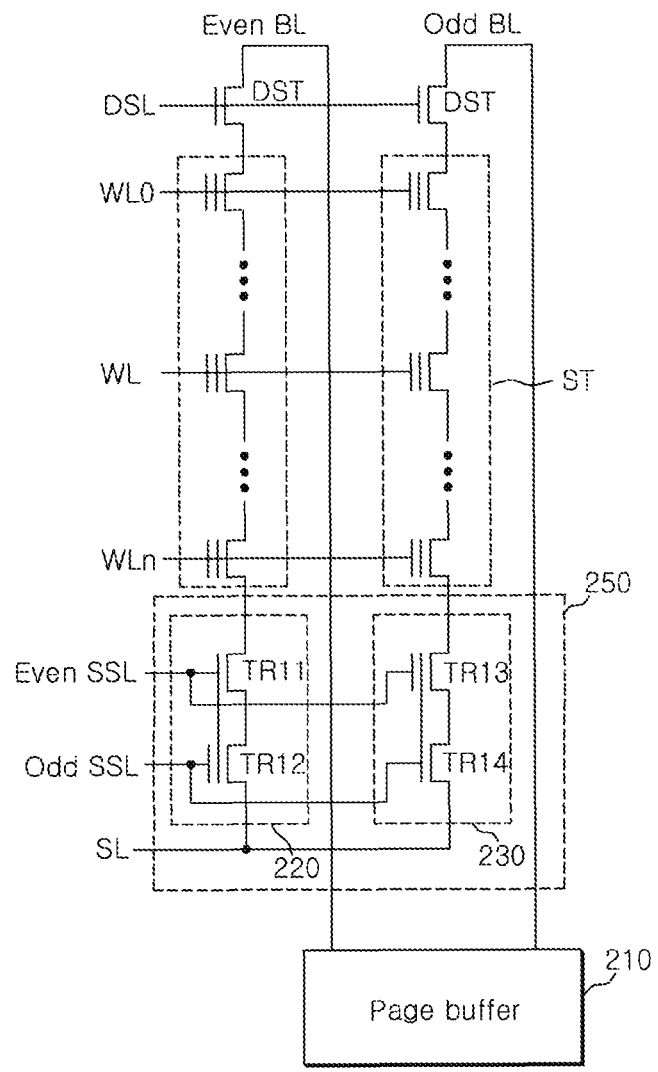
FIG. 7 is a schematic circuit diagram illustrating a flash memory in accordance with another exemplary embodiment of the present invention.

For example, as shown in FIG. 7, a flash memory 200 may include a page buffer 210, an even bit line Even BL, an odd bit line Odd BL, drain select transistors DST, even and odd memory cell strings ST, and a bit line select unit 250.

Similarly to the aforementioned embodiments, the page buffer 210 is coupled to the even bit line Even BL and the odd bit line Odd BL, and functions to latch data that will be provided to one of the even bit line Even BL or the odd bit line Odd BL (whichever is to be selected). Alternatively or additionally, the page buffer 210 is configured to evaluate and store the data stored in the corresponding memory cell string ST.

The memory cell strings ST are respectively installed on the even bit line Even BL and the odd bit line Odd BL. The memory cell strings ST may have substantially the same configuration as the memory cell strings ST of the aforementioned embodiments.

The drain select transistors DST are respectively coupled between the even bit line Even BL and the even memory cell string ST and between the odd bit line Odd BL and the odd memory cell string ST. These drain select transistors DST are driven in response to the signal of a drain select line DSL. The drain select transistors DST and the drain select line DSL for driving the drain select transistors DST may constitute a switch for selecting the drain of the memory cell string ST.

The bit line select unit 250 is coupled between the even and odd memory cell strings ST and a source line SL. The bit line select unit 250 may include a first path section 220 and a second path section 230.

The first path section 220 may serve as a switch that generates a signal transfer path between the even memory cell string ST and the source line SL in response to the signal of an even source select line Even SSL.

The first path section 220 may comprise a first transistor TR11 configured to be turned on in response to the signal of the even source select line Even SSL and a second transistor TR12 coupled in series to the first transistor TR11 and selectively responds to the signal of the even source select line Even SSL or the signal of an odd source select line Odd SSL.

As shown in FIG. 8, the first transistor TR11 may have a structure similar to that of a gate of a flash memory transistor, and includes a first control gate CG11 and a first floating gate FG11 being electrically coupled to each other by a contact via. As a result, the first transistor TR11 can be driven like a general MOS transistor. The even source select line Even SSL is coupled to the first control gate CG11 of the first transistor TR11.

The second transistor TR12 has the structure of a flash memory transistor that includes a second floating gate FG12 and a second control gate CG12 isolated from the second floating gate FG12. The odd source select line Odd SSL is coupled to the second control gate CG12, and the floating gate FG12 is floated. The first floating gate FG11 of the first transistor TR11 and the second floating gate FG12 of the second transistor TR12 may be electrically coupled to each other (e.g., integrally formed with each other). Reference characters "201" and "205" shown in FIG. 8 designate a semiconductor substrate and a junction region, respectively.

The second path section 230 may serve as a switch that generates a signal transfer path between the odd memory cell string ST and the source line SL in response to the signal of the odd source select line Odd SSL.

The second path section 230 may comprise a third transistor TR13, which selectively responds to the signal of the even or odd source select line Even SSL or Odd SSL, and a fourth transistor TR14, which is coupled in series to the third transistor TR13 and selectively responds to the signal of the odd source select line Odd SSL.

As shown in FIG. 9, the third transistor TR13 may have a structure of a flash memory transistor that includes a third control gate CG13 coupled to the even source select line Even SSL and a third floating gate FG13 electrically isolated from the third control gate CG13.

The fourth transistor TR14 may have a structure of a general MOS transistor, in which a fourth control gate CG14 and a fourth floating gate FG14 are electrically coupled to each other by a contact via, and is driven in response to the signal of the odd source select line Odd SSL.

The third floating gate FG13 of the third transistor TR13 and the fourth floating gate FG14 of the fourth transistor TR14 may be electrically coupled to each other. In one exemplary embodiment, they may be integrated with each other.

Even in the case where the bit line select unit 250 is designed to be driven selectively in response to the signal of the even source select line and the signal of the odd source select line as described above, programming and verification can be implemented through the same voltage pulsing as in the aforementioned embodiment.

While certain embodiments have been described above, it will be understood to those skilled in the art that the embodiments described are by way of example only. Accordingly, the nonvolatile memory apparatus capable of reducing current consumption and the method for driving the same described herein should not be limited based on the described embodiments. Rather, the nonvolatile memory apparatus capable of reducing current consumption and the method for driving the same described herein should only be limited in light of the claims that follow when taken in conjunction with the above description and accompanying drawings.

What is claimed is:

1. A nonvolatile memory apparatus comprising:
 a page buffer;
 an even bit line coupled to the page buffer;
 an odd bit line connected to the page buffer;
 an even memory cell string coupled on the even bit line;
 an odd memory cell string coupled on the odd bit line; and
 a bit line select unit including a first path section coupled between the even bit line and the even memory cell string, and a second path section coupled between the odd bit line and the odd memory cell string,
 wherein the first path section and the second path section include a MOS transistor and a flash transistor coupled in series to the MOS transistor, respectively, and
 wherein the MOS transistor of the first path section is turned on in response to a signal of an even drain select line, and the flash transistor of the first path section is turned on in response to the signal of the even drain select line or a signal of an odd drain select line.

2. The nonvolatile memory apparatus according to claim 1, wherein a gate of the MOS transistor of the first path section is electrically coupled to a floating gate of the flash transistor of the first path section.

3. The nonvolatile memory apparatus according to claim 1, wherein the MOS transistor of the first path section comprises a control gate and a floating gate electrically coupled to the control gate.

4. The nonvolatile memory apparatus according to claim 1, wherein the flash transistor of the second path section is turned on in response to a signal of an even drain select line and a signal of an odd drain select line; and
 the MOS transistor coupled in series to the flash transistor of the second path section and is turned on in response to the signal of the odd drain select line.

5. The nonvolatile memory apparatus according to claim 4, wherein a gate of the MOS transistor of the second path section is electrically coupled to a floating gate of the flash transistor of the second path section.

6. The nonvolatile memory apparatus according to claim 4, wherein the MOS transistor of the second path section comprises a control gate and a floating gate electrically coupled to the control gate.

7. The nonvolatile memory apparatus according to claim 1, further comprising:
 a source line; and
 source select parts respectively coupled between the even memory cell string and the source line and between the odd memory cell string and the source line.

8. The nonvolatile memory apparatus according to claim 7, wherein the source select parts comprise transistors configured to be driven in response to a signal of a source select line.

9. A nonvolatile memory apparatus comprising:
 a page buffer;
 an even bit line coupled to the page buffer;
 an odd bit line connected to the page buffer;
 an even memory cell string coupled on the even bit line;
 an odd memory cell string coupled on the odd bit line;
 a source line; and
 a bit line select unit coupled between the even and odd memory cell strings and the source line and is configured to selectively generate a signal read path between the even or odd memory cell string to be selected and the source line in response to a signal of an even or odd source select line,
 wherein the bit line select unit includes a first path section coupled between the even memory cell string and the source line, and a second path section coupled between the odd memory cell string and the source line,
 wherein the first path section and the second path section include a MOS transistor and a flash transistor coupled in series to the MOS transistor, respectively, and
 wherein the MOS transistor of the first path section is configured to respond to the signal of the even source select line, and the flash transistor of the first path section is coupled in series to the MOS transistor of the first path section and is configured to respond to the signal of the even or odd source select line.

10. The nonvolatile memory apparatus according to claim 9, wherein a gate of the MOS transistor of the first path section is electrically coupled to a floating gate of the flash transistor.

11. The nonvolatile memory apparatus according to claim 9, wherein the MOS transistor of the first path section comprises a control gate and a floating gate which is electrically coupled to the control gate.

12. The nonvolatile memory apparatus according to claim 9, wherein the flash transistor of the second path section is turned on in response to the signal of the even or odd source select line; and
the MOS transistor of the second path section coupled in series to the flash transistor of the second path section and is turned on in response to the signal of the odd source select line.

13. The nonvolatile memory apparatus according to claim 12, wherein a gate of the MOS transistor of the second path section is electrically coupled to a floating gate of the flash transistor.

14. The nonvolatile memory apparatus according to claim 12, wherein the MOS transistor of the second path section comprises a control gate and a floating gate electrically coupled to the control gate.

15. The nonvolatile memory apparatus according to claim 9, further comprising:
drain select parts respectively positioned between the even bit line and the even memory cell string and between the odd bit line and the odd memory cell string.

16. The nonvolatile memory apparatus according to claim 15, wherein the drain select parts comprise transistors configured to be driven in response to a drain select line.

17. A nonvolatile memory apparatus comprising:
a first bit line;
a second bit line; and
a bit line select unit configured to generate a path for transferring data stored in a memory cell string installed on one selected between the first and second bit lines when reading data, the bit line select unit being further configured to shield a path between the unselected one of the first and second bit line and a memory cell string installed on the unselected bit line,
wherein the bit line select unit comprises:
a first transistor coupled to the first bit line and comprising a first floating gate and a first control gate electrically connected to the first floating gate, the first transistor being configured to be turned on in response to a first select signal;
a second transistor coupled to the first transistor and comprising a second floating gate electrically coupled to the first floating gate and a second control gate electrically isolated from the second floating gate, the second transistor being configured to be turned on in response to a second select signal;
a third transistor coupled to the second bit line and comprising a third floating gate and a third control gate electrically isolated from the third floating gate, the third transistor being configured to be turned on in response to the first select signal; and
a fourth transistor coupled to the third transistor and comprising a fourth floating gate electrically coupled to the third floating gate and a fourth control gate electrically isolated from the fourth floating gate, the fourth transistor being configured to switch a signal transferred from the third transistor in response to the second select signal,
wherein the first floating gate and the first control gate of the first transistor are electrically coupled to each other by a contact via.

18. The nonvolatile memory apparatus according to claim 17, wherein the first floating gate of the first transistor and the second floating gate of the second transistor are integrated with each other.

19. The nonvolatile memory apparatus according to claim 17, wherein the fourth floating gate and the fourth control gate of the fourth transistor are electrically coupled to each other by a contact via.

20. The nonvolatile memory apparatus according to claim 17, wherein the third floating gate of the third transistor and the fourth floating gate of the fourth transistor are integrated with each other.

21. The nonvolatile memory apparatus according to claim 17, wherein a drain of the first transistor contacts the first bit line, and a source of the second transistor contacts the memory cell string which is installed on the first bit line.

22. The nonvolatile memory apparatus according to claim 17, wherein a drain of the third transistor contacts the second bit line, and a source of the fourth transistor contacts the memory cell string which is installed on the second bit line.

23. The nonvolatile memory apparatus according to claim 17, wherein the first and second select signals are signals for selecting drains of the memory cell strings and have opposite phases.

24. The nonvolatile memory apparatus according to claim 21, wherein the first select signal is enabled when the first bit line is selected, and the second select signal is enabled when the second bit line is selected.

25. A nonvolatile memory apparatus comprising:
a first bit line;
a second bit line; and
a bit line select unit configured to generate a path for transferring data stored in a memory cell string installed on one selected between the first and second bit lines when reading data, the bit line select unit being further configured to shield a path between the unselected one of the first and second bit lines and a memory cell string installed on the unselected bit line,
wherein the bit line select unit comprises:
a first transistor coupled to the memory cell string installed on the first bit line and comprising a first floating gate and a first control gate electrically coupled to the first floating gate, the first transistor being configured to be turned on in response to a first select signal;
a second transistor coupled between the first transistor and a source line and comprising a second floating gate electrically coupled to the first floating gate and a second control gate electrically isolated from the second floating gate, the second transistor being configured to be turned on in response to a second select signal;
a third transistor coupled to the memory cell string installed on the second bit line and comprising a third floating gate and a third control gate electrically isolated from the third floating gate, the third transistor being configured to be turned on in response to the first select signal; and
a fourth transistor coupled between the third transistor and the source line and comprising a fourth floating gate electrically coupled to the third floating gate and a fourth control gate electrically isolated from the fourth floating gate, the fourth transistor being configured to switch a signal transferred from the third transistor in response to the second select signal.

26. The nonvolatile memory apparatus according to claim 25, wherein a drain of the first transistor contacts a source of the memory cell string installed on the first bit line, and a source of the second transistor contacts the source line.

27. The nonvolatile memory apparatus according to claim 26, wherein a drain of the third transistor contacts a source of the memory cell string installed on the second bit line, and a source of the fourth transistor contacts the source line.

28. The nonvolatile memory apparatus according to claim 25, wherein the first and second select signals are signals for selecting the sources of the memory cell strings and have opposite phases.

29. The nonvolatile memory apparatus according to claim 28, wherein the first select signal is enabled when the first bit line is selected, and the second select signal is enabled when the second bit line is selected.

* * * * *